United States Patent
Takamine

(10) Patent No.: US 7,369,015 B2
(45) Date of Patent: May 6, 2008

(54) BALANCED SURFACE ACOUSTIC WAVE FILTER

(75) Inventor: Yuichi Takamine, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/697,507

(22) Filed: Apr. 6, 2007

(65) Prior Publication Data

US 2007/0171003 A1 Jul. 26, 2007

Related U.S. Application Data

(63) Continuation of application No. PCT/JP2005/018754, filed on Oct. 12, 2005.

(30) Foreign Application Priority Data

Oct. 22, 2004 (JP) .............................. 2004-308483

(51) Int. Cl.
*H03H 9/54* (2006.01)
(52) U.S. Cl. ...................... 333/193; 333/195
(58) Field of Classification Search ................ 333/193, 333/195
See application file for complete search history.

(56) References Cited

U.S. PATENT DOCUMENTS

| 5,568,002 | A | | 10/1996 | Kawakatsu et al. |
| 5,790,000 | A | * | 8/1998 | Dai et al. .................... 333/193 |
| 6,268,782 | B1 | * | 7/2001 | Hartmann et al. .......... 333/193 |
| 6,329,888 | B1 | * | 12/2001 | Hirota ........................ 333/193 |
| 6,667,673 | B1 | | 12/2003 | Strauss |
| 6,720,842 | B2 | | 4/2004 | Sawada |
| 6,744,333 | B2 | | 6/2004 | Sawada |
| 6,759,928 | B2 | | 7/2004 | Endou et al. |
| 6,762,657 | B2 | | 7/2004 | Takamine |

(Continued)

FOREIGN PATENT DOCUMENTS

JP 06-204781 A 7/1994

(Continued)

OTHER PUBLICATIONS

Official Communication for PCT Application No. PCT/JP2005/018754; mailed on Jan. 17, 2006.

(Continued)

*Primary Examiner*—Barbara Summons
(74) *Attorney, Agent, or Firm*—Keating & Bennett, LLP

(57) ABSTRACT

A surface acoustic wave filter includes first to fifth IDTs arranged on a piezoelectric substrate along a surface acoustic wave propagation direction. The second IDT and the fourth IDT have a phase difference of 180° with respect to each other. The second and fourth IDTs are connected to an unbalanced terminal. The third IDT includes a first sub-IDT portion and a second sub-IDT portion. The first IDT and the first sub-IDT portion are connected to a first balanced terminal, and the second sub-IDT portion and the fifth IDT are connected to a second balanced terminal. The following conditions: $1.55 \leq N3/N1 \leq 2.58$ and $N1=N5$ are satisfied, where $N1$ denotes the number of electrode fingers that determines the center frequency of the first IDT, $N3$ denotes the number of electrode fingers that determines the center frequency of the third IDT, and $N5$ denotes the number of electrode fingers that determines the center frequency of the fifth IDT.

5 Claims, 5 Drawing Sheets

U.S. PATENT DOCUMENTS

| | | | |
|---|---|---|---|
| 6,781,485 B2 * | 8/2004 | Takamine et al. | 333/195 |
| 2004/0066115 A1 | 4/2004 | Takamine | |
| 2004/0080383 A1 * | 4/2004 | Takamine | 333/194 |
| 2004/0080385 A1 | 4/2004 | Takamine et al. | |
| 2005/0212621 A1 * | 9/2005 | Takamine | 333/195 |

FOREIGN PATENT DOCUMENTS

| | | |
|---|---|---|
| JP | 11-097966 A | 4/1999 |
| JP | 2000-091883 A | 3/2000 |
| JP | 2001-308672 A | 11/2001 |
| JP | 2001-313540 A | 11/2001 |
| JP | 2003-507917 A | 2/2003 |
| JP | 2003-179462 A | 6/2003 |
| JP | 2004-088551 A | 3/2004 |
| JP | 2004-096244 A | 3/2004 |
| WO | 01/13514 A1 | 2/2001 |
| WO | 02/03549 A1 | 1/2002 |

OTHER PUBLICATIONS

Official communication issued in counterpart European Application No. 05793732.8, mailed on Dec. 21, 2007.

* cited by examiner

BALANCED SURFACE ACOUSTIC WAVE FILTER

BACKGROUND OF THE INVENTION

1. Field of the Invention

The present invention relates to a longitudinally coupled resonator type balanced surface acoustic wave filter having a balanced-unbalanced conversion function, and in particular, to a balanced surface acoustic wave filter including five IDTs arranged along a surface acoustic wave propagation direction.

2. Description of the Related Art

In recent years, balanced surface acoustic wave filters having a balanced-unbalanced conversion function have been used for bandpass filters in an RF stage of cell phones. In particular, longitudinally coupled resonator type balanced surface acoustic wave filters have been primarily used since the longitudinally coupled resonator type balanced surface acoustic wave filters can support high frequencies and can easily provide a balanced-unbalanced conversion function.

A balanced surface acoustic wave filter having a balanced-unbalanced conversion function is connected to a balanced mixer IC having a balanced input/output or a differential input/output. By using this balanced mixer IC, the balanced surface acoustic wave filter can reduce the effect of noise and stabilize the output thereof. Accordingly, in recent years, balanced mixer ICs have been widely used in order to improve the characteristics of cell phones. Surface acoustic wave filters connected to a balanced mixer IC must have a balanced-unbalanced conversion function.

A variety of types of surface acoustic wave filter having a balanced-unbalanced conversion function have been disclosed. An example of such a balanced surface acoustic wave filter is described in Japanese Unexamined Patent Application Publication No. 2004-96244 (Patent Document 1).

FIG. 7 is a cross-sectional plan view schematically illustrating the balanced surface acoustic wave filter described in Patent Document 1.

A balanced surface acoustic wave filter 101 includes a one-port surface acoustic wave resonator 103 to be connected to an unbalanced terminal 102. A surface acoustic wave filter unit 104 is connected downstream of the one-port surface acoustic wave resonator 103. The surface acoustic wave filter unit 104 includes first to fifth IDTs 105 to 109 disposed in that order along the surface acoustic wave propagation direction. Reflectors 110 and 111 are disposed at either end of an area in which the IDTs 105 to 109 are disposed in the surface acoustic wave propagation direction.

Here, the second IDT 106 and the fourth IDT 108 are connected to the unbalanced terminal 102 via the one-port surface acoustic wave resonator 103. The second IDT 106 and the fourth IDT 108 have a phase difference of 180° with respect to each other. The third IDT 107 is divided into a first sub-IDT portion 107a and a second sub-IDT portion 107b in the surface acoustic wave propagation direction.

The first IDT 105 and the first sub-IDT portion 107a are mutually connected and are connected to a first balanced terminal 112. Additionally, the second sub-IDT portion 107b and the fifth IDT 109 are mutually connected and are connected to a second balanced terminal 113. In recent years, for a surface acoustic wave filter having a balanced-unbalanced conversion function, a low insertion loss in the passband and a terminal impedance that can be easily adjusted have been highly desirable. In addition, compact bodies of surface acoustic wave devices have been highly desirable.

Similar to the balanced surface acoustic wave filter 101, longitudinally coupled resonator type balanced surface acoustic wave filters including five IDTs 105 to 109 advantageously achieve the above-described requirement.

However, although the surface acoustic wave filters including the 5-IDT balanced-unbalanced conversion function, such as the balanced surface acoustic wave filter 101, can provide a reduction of the insertion loss in the passband, a terminal impedance capable of being easily adjusted, and a reduction in the body size, undesired spurious components are generated in the vicinity of the passband.

SUMMARY OF THE INVENTION

To overcome the problems described above, preferred embodiments of the present invention provide a 5-IDT balanced surface acoustic wave filter that has a balanced-unbalanced conversion function and that efficiently reduces spurious components in the vicinity of the passband, and therefore, provides excellent filter characteristics.

According to a preferred embodiment of the present invention, a balanced surface acoustic wave filter having an unbalanced terminal and first and second balanced terminals and having a balanced-unbalanced conversion function is provided. The balanced surface acoustic wave filter includes a piezoelectric substrate and first to fifth IDTs disposed on the piezoelectric substrate along a surface acoustic wave propagation direction. The second and fourth IDTs are connected to the unbalanced terminal, and the second IDT and the fourth IDT have a phase difference of 180° with respect to each other. The third IDT is divided into a first sub-IDT portion and a second sub-IDT portion along the surface acoustic wave propagation direction, the first sub-IDT portion and the first IDT are connected to the first balanced terminal, and the second sub-IDT portion and the fifth IDT are connected to the second balanced terminal. Here, the conditions of $1.55 \leq N3/N1 \leq 2.58$ and $N1=N5$ are preferably satisfied, where N1 denotes the number of electrode fingers that determines the center frequency of the first IDT, N3 denotes the number of electrode fingers that determines the center frequency of the third IDT, and N5 denotes the number of electrode fingers that determines the center frequency of the fifth IDT.

In one preferred embodiment, the balanced surface acoustic wave filter further includes a second surface acoustic wave filter unit connected in a cascade arrangement to a first surface acoustic wave filter unit defined by the first to fifth IDTs. The second surface acoustic wave filter unit includes a piezoelectric substrate and sixth to tenth IDTs disposed on the piezoelectric substrate along a surface acoustic wave propagation direction, and the eighth IDT is divided into a first sub-IDT portion and a second sub-IDT portion along the surface acoustic wave propagation direction. Here, the conditions of $1.55 \leq N8/N6 \leq 2.58$ and $N6=N10$ are preferably satisfied, where N6 denotes the number of electrode fingers that determines the center frequency of the sixth IDT, N8 denotes the number of electrode fingers that determines the center frequency of the eighth IDT, and N10 denotes the number of electrode fingers that determines the center frequency of the tenth IDT.

In another preferred embodiment, the first IDT, the first sub-IDT portion, the second sub-IDT portion, and the fifth IDT of the first surface acoustic wave filter unit are connected to the sixth IDT, the first sub-IDT portion of the eighth IDT, the second sub-IDT portion of the eighth IDT, and the ninth IDT of the second surface acoustic wave filter unit via first to fourth signal lines, respectively. Preferably, signals propagating in the first and third signal lines and signals propagating in the second and fourth signal lines have a phase difference of 180° with respect to each other.

In still another preferred embodiment, the balanced surface acoustic wave filter further includes a second surface acoustic wave filter unit longitudinally connected between the unbalanced terminal and a first surface acoustic wave filter unit defined by the first to fifth IDTs. The second IDT and the fourth IDT have the same phase, and the second surface acoustic wave filter unit includes a piezoelectric substrate and sixth to tenth IDTs disposed on the piezoelectric substrate along a surface acoustic wave propagation direction. The seventh IDT and the ninth IDT have a phase difference of 180° with respect to each other. The sixth IDT, the eighth IDT, and the tenth IDT are connected to the unbalanced terminal, and the seventh IDT and the ninth IDT are electrically connected to the second IDT and the fourth IDT using a first signal line and a second signal line, respectively. Preferably, a signal propagating in the first signal line and a signal propagating in the second signal line have a phase difference of 180° with respect to each other.

In a balanced surface acoustic wave filter according to various preferred embodiments of the present invention, first to fifth IDTs are disposed on a piezoelectric substrate along a surface acoustic wave propagation direction. The second and fourth IDTs are connected to an unbalanced terminal. The third IDT is divided into a first sub-IDT portion and a second sub-IDT portion, the first sub-IDT portion and the first IDT are connected to a first balanced terminal, and the second sub-IDT portion and the fifth IDT are connected to a second balanced terminal. Accordingly, a 5-IDT longitudinally coupled resonator type balanced surface acoustic wave filter that has a balanced-unbalanced conversion function can be provided. In addition, according to various preferred embodiments of the present invention, the conditions of $1.55 \leq N3/N1 \leq 2.58$ and $N1=N5$ satisfied, where N1 denotes the number of electrode fingers that determines the center frequency of the first IDT, N3 denotes the number of electrode fingers that determines the center frequency of the third IDT, and N5 denotes the number of electrode fingers that determines the center frequency of the fifth IDT. Consequently, the occurrence of a spurious component in the vicinity of the passband is reliably prevented. As a result, excellent filter characteristics are obtained.

Accordingly, in addition to the following original advantages of 5-IDT longitudinally coupled resonator type balanced surface acoustic wave filters: 1) a low insertion loss in the passband; 2) easy adjustment of the terminal impedance; and 3) reduction in the size of the device, the 5-IDT longitudinally coupled resonator type balanced surface acoustic wave filter according to various preferred embodiments of the present invention reduces the occurrence of a spurious component in the vicinity of the passband. Consequently, the balanced surface acoustic wave filter according to preferred embodiments of the present invention can be suitably applied to, for example, a band-pass filter of the RF stage of a cell phone.

According to various preferred embodiments of the present invention, a second surface acoustic wave filter unit is connected in a cascade arrangement to a first surface acoustic wave filter unit. Similar the first surface acoustic wave filter unit, the second surface acoustic wave filter unit includes five IDTs, that is, sixth to tenth IDTs. If the conditions of $1.55 \leq N8/N6 \leq 2.58$ and $N6=N10$ are satisfied, the occurrence of a spurious component in the vicinity of the passband is reliably prevented as in the first surface acoustic wave filter unit. In addition, since a longitudinal connection in a two-stage arrangement is used, the attenuation outside the passband is increased.

The structure in which the second surface acoustic wave filter unit is connected in a cascade arrangement to the first surface acoustic wave filter unit is realized by, for example, electrically connecting the first IDT, the first sub-IDT portion, the second sub-IDT portion, and the fifth IDT to the sixth IDT, the first sub-IDT portion of the eighth IDT, the second sub-IDT portion of the eighth IDT, and the ninth IDT of the second surface acoustic wave filter unit using first to fourth signal lines, respectively. In such a case, if signals propagating in the first and third signal lines and signals propagating in the second and fourth signal lines have a phase difference of 180° with respect to each other, the balance of the surface acoustic wave filter is improved.

According to preferred embodiments of the present invention, the balanced surface acoustic wave filter further includes a second surface acoustic wave filter unit longitudinally connected between the unbalanced terminal and a first surface acoustic wave filter unit formed from the first to fifth IDTs. The second IDT and the fourth IDT have the same phase, and the second surface acoustic wave filter unit includes a piezoelectric substrate and sixth to tenth IDTs disposed on the piezoelectric substrate along a surface acoustic wave propagation direction. The seventh IDT and the ninth IDT have a phase difference of 180° with respect to each other. The sixth IDT, the eighth IDT, and the tenth IDT are connected to the unbalanced terminal, and the seventh IDT and the ninth IDT are electrically connected to the second IDT and the fourth IDT using a first signal line and a second signal line, respectively. In such a case, the attenuation can be increased. If a signal propagating in the first signal line and a signal propagating in the second signal line have a phase difference of 180° with respect to each other, the balance of the surface acoustic wave filter is improved.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention are described below with reference to the accompanying drawings.

First Preferred Embodiment

Figure 1:
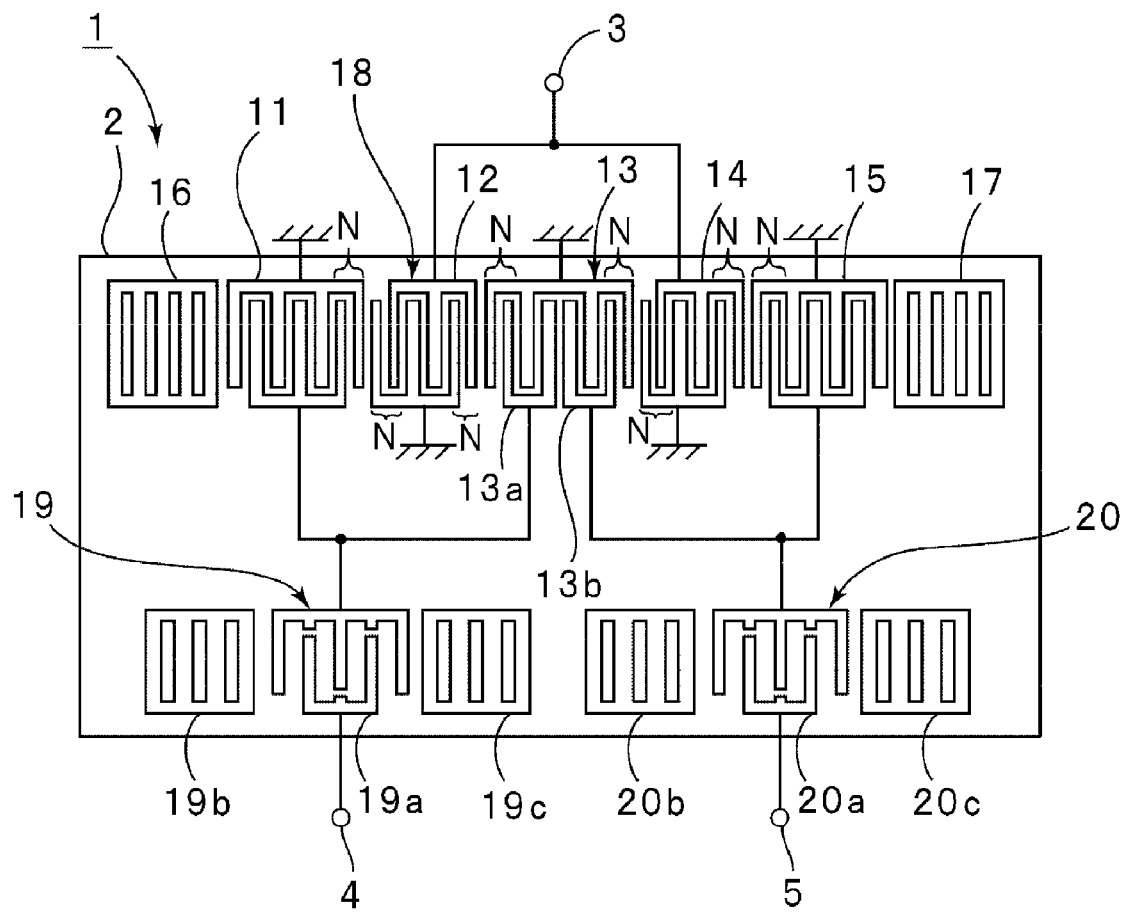
FIG. 1 is a plan view schematically illustrating a surface acoustic wave filter according to a first preferred embodiment of the present invention.

FIG. 1 is a plan view schematically illustrating a surface acoustic wave filter according to a preferred embodiment of the present invention.

A surface acoustic wave filter 1 according to the present preferred embodiment includes a plate like piezoelectric substrate 2. According to the present preferred embodiment, the piezoelectric substrate 2 is preferably composed of a 40±5° Y-cut X-propagation $LiTaO_3$ substrate. The surface acoustic wave filter 1 is a balanced surface acoustic wave filter including an unbalanced terminal 3, a first balanced terminal 4, and a second balanced terminal 5 and has a balanced-unbalanced conversion function. In addition, the surface acoustic wave filter 1 according to the present preferred embodiment is used for a DCS reception bandpass filter. The impedance of the unbalanced terminal 3 is preferably about 50 Ω. The impedances of the first balanced terminal 4 and the second balanced terminal 5 are preferably about 100 Ω.

A longitudinally coupled resonator type balanced surface acoustic wave filter unit 18 including first to fifth IDTs 11 to 15 and reflectors 16 and 17 is provided on the piezoelectric substrate 2. The first to fifth IDTs 11 to 15 are disposed in the longitudinally coupled resonator type balanced surface acoustic wave filter unit 18 in this order in a direction in which the surface acoustic waves propagate. In addition, the reflectors 16 and 17 are disposed at either end of an area in which the first to fifth IDTs 11 to 15 are disposed in the surface acoustic wave propagation direction.

According to the present preferred embodiment, one end of the second IDT 12 and one end of the fourth IDT 14 are connected to the unbalanced terminal 3. The other end of the second IDT 12 and the other end of the fourth IDT 14 are connected to ground potential. The second IDT 12 and the fourth IDT 14 have a phase difference of 180° with respect to each other.

In contrast, the middle third IDT 13 is divided into two portions in the surface acoustic wave propagation direction. That is, the third IDT 13 includes a first sub-IDT portion 13a adjacent to the second IDT 12 and a second sub-IDT portion 13b adjacent to the fourth IDT 14.

One end of the first IDT 11 and the first sub-IDT portion 13a of the third IDT 13 are connected to the first balanced terminal 4 via a one-port surface acoustic wave resonator 19, which is described later.

In addition, the second sub-IDT portion 13b of the third IDT 13 and one end of the fifth IDT 15 are mutually connected and are connected to the second balanced terminal 5 via a one-port surface acoustic wave resonator 20.

The one-port surface acoustic wave resonators 19 and 20 are not always required. However, by providing the one-port surface acoustic wave resonators 19 and 20, attenuation in the vicinity of the higher frequency side of the passband can be increased.

The one-port surface acoustic wave resonators 19 and 20 include IDTs 19a and 20a, respectively. Reflectors 19b and 19c are disposed at either end of the IDT 19a in the surface acoustic wave propagation direction. In addition, reflectors 20b and 20c are disposed at either end of the IDT 20a in the surface acoustic wave propagation direction.

According to the present preferred embodiment, electrodes that define the longitudinally coupled resonator type balanced surface acoustic wave filter unit 18, the one-port surface acoustic wave resonator 19, and the one-port surface acoustic wave resonator 20 are made of an Al film. However, according to the present invention, the electrodes that define the surface acoustic wave filter can be formed from an appropriate metal other than Al or an appropriate alloy. In addition, the electrodes may have a structure in which a plurality of electrode layers is stacked.

In the longitudinally coupled resonator type balanced surface acoustic wave filter unit 18, a narrow-pitch electrode finger unit N is provided at a position at which the two IDTs face each other. For example, at a position at which the IDT 11 faces the IDT 12, a narrow-pitch electrode finger portion N is provided at an end of the first IDT 11 adjacent to the second IDT 12. Similarly, a narrow-pitch electrode finger portion N is provided at an end of the second IDT 12 adjacent to the first IDT 11. The term "narrow-pitch electrode finger portion N" refers to an electrode finger portion having a pitch of electrode fingers relatively smaller than that of the other electrode finger portion.

By providing the narrow-pitch electrode finger portion N at positions at which two IDTs face each other, discontinuity at the positions at which two IDTs face each other is reduced. Accordingly, by controlling the size of a gap at a position at which two IDTs face each other, a wide-band filter characteristic is obtained.

However, according to various preferred embodiments of the present invention, the narrow-pitch electrode finger portion N is not necessarily provided at a position at which the IDTs face each other.

In addition, the center frequency of the IDT is determined by the electrode finger pitch of a portion excluding the narrow-pitch electrode finger portion N. That is, for the IDT having the narrow-pitch electrode finger portion N, the number of electrode fingers that determines the center frequency of the IDT according to preferred embodiments of the present invention is determined by subtracting the number of electrode fingers in the narrow-pitch electrode finger portion from the number of electrode fingers of that IDT. Accordingly, in the case of the IDT 11, the number of electrode fingers N1 that determines the center frequency of the first IDT 11 is obtained by subtracting the number of electrode fingers of the narrow-pitch electrode finger portion N located at the end of the IDT 11 adjacent to the IDT 12 from the number of electrode fingers of the IDT 11. Furthermore, in the case of the third IDT 13, the narrow-pitch electrode finger portion N is provided at either end of the third IDT 13 in the surface acoustic wave propagation direction. Therefore, the number of electrode fingers N3 that determines the center frequency of the IDT 13 is obtained by subtracting the sum of the numbers of electrode fingers of the two narrow-pitch electrode finger portions N from the number of electrode fingers of the IDT 13.

The number of electrode fingers N5 that determines the center frequency of the fifth IDT 15 can be determined in the same manner as used for determining the number of electrode fingers N1 that determines the center frequency of the first IDT 11.

In the present preferred embodiment, the relationship among the above-described N1, N3, and N5 is preferably determined by $1.55 \leq N3/N1 \leq 2.58$ and $N1=N5$. This relationship efficiently reduces the occurrence of a spurious component in the vicinity of the passband. This advantage is described in more detail next through a particular example of an experiment.

The longitudinally coupled resonator type balanced surface acoustic wave filter unit 18 and the one-port surface acoustic wave resonators 19 and 20 were provided on the piezoelectric substrate 2 preferably composed of a 40±5° Y-cut X-propagation LiTaO$_3$ substrate so that the surface acoustic wave filter 2 having the following specification was produced.

Specification of Longitudinally Coupled Resonator Type Balanced Surface Acoustic Wave Filter Unit 18

A finger cross width of electrode fingers: 105 μm.

The number of electrode fingers of IDTs: the first IDT 11-28 (5), the second IDT 12-(4) 27 (4), the third IDT 13-(5) 54 (5), the fourth IDT 14-(4) 27 (4), and the fifth IDT 15-(5) 28.

Each of the numbers in parentheses represents the number of electrode fingers of a narrow-pitch electrode finger portion provided for one of the IDTs, and each of the numbers without parentheses represents the number of electrode fingers of a portion excluding the narrow-pitch electrode finger portion.

The number of electrode fingers of the reflectors 16 and 17: 80.

The metallization ratio: 0.68.

Thickness of the electrode film: 0.092λI.

λI denotes a wavelength determined by the pitch of the electrode fingers.

Specification of the Surface Acoustic Wave Resonators 19 and 20

A finger cross width of electrode fingers: 45 μm.

The number of electrode fingers of the IDTs 19a and 20a: 161.

The number of electrode fingers of the reflectors 19b, 19c, 20b, and 20c: 15.

The metallization ratio: 0.60.

Figure 2:
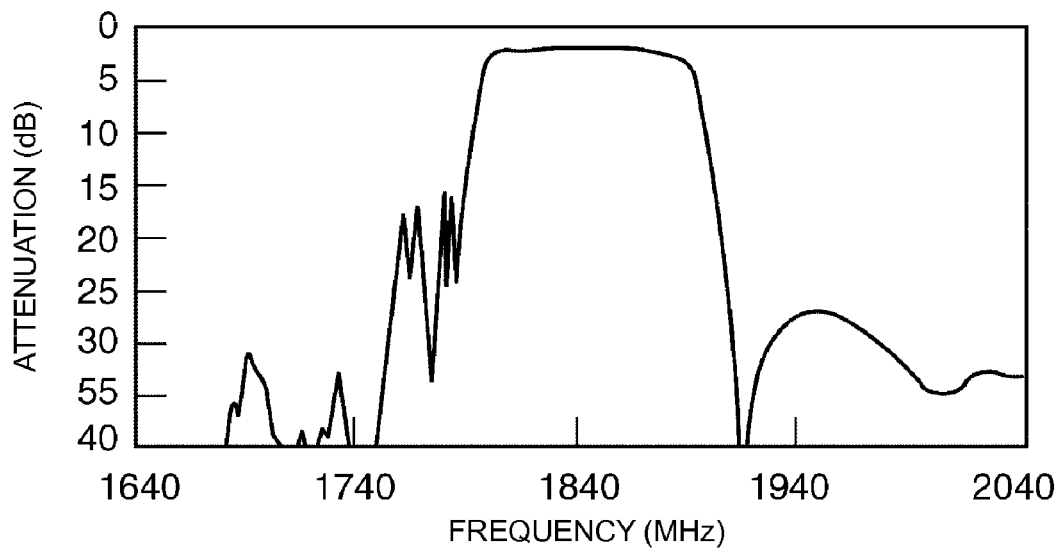
FIG. 2 illustrates the attenuation-frequency characteristic of the surface acoustic wave filter according to the first preferred embodiment of the present invention.

FIG. 2 illustrates the attenuation-frequency characteristic of the surface acoustic wave filter 1 of the present preferred embodiment which is produced in the above-described manner. The passband of the surface acoustic wave filter 1 according to the present preferred embodiment is from about 1805 MHz to about 1880 MHz. As shown in FIG. 2, no significant spurious components appear in the vicinity of the passband. This is described in more detail next. Let N1 to N5 denote the number of electrode fingers that determine the center frequencies of the first to fifth IDTs 11 to 15, respectively. Then, the frequency characteristics on the lower side of the passband when the number of pairs of the electrode fingers is changed are illustrated in FIGS. 3 and 4.

Figure 3:
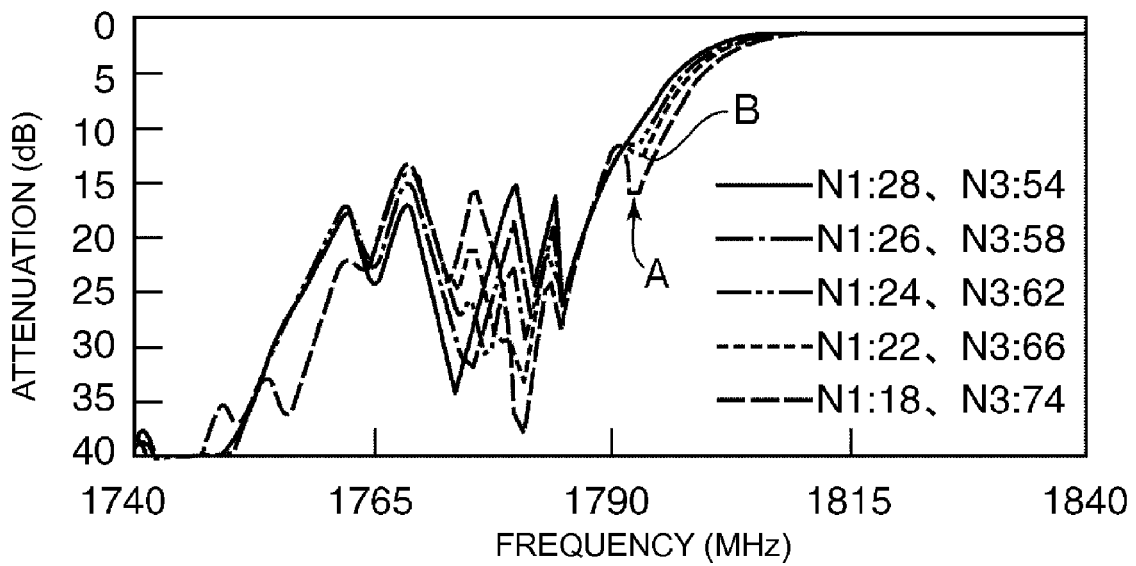
FIG. 3 illustrates a change in the frequency characteristic on the low frequency side of the passband when the numbers of electrode fingers N1 and N3 that respectively determine the center frequencies of first and third IDTs are changed.

In FIG. 3, N1, N2, N4, and N5 were determined so that N2=N4=27 (fixed number) and N1=N5. Then, N1 and N3 were changed so that N3/N1 increased. In this manner, five surface acoustic wave filters having different (N3/N1)s were produced, and the frequency characteristics of these surface acoustic wave filters were measured. As shown in FIG. 3, when N1 is greater than or equal to 24 and N3 is less than or equal to 62, no spurious components appear in the vicinity of the passband. In contrast, when N1=22 and N3=66, a small spurious component appears at a frequency of about 1792 MHz, as indicated by an arrow B. In addition, when N1=18 and N3=74, this spurious component increases, and therefore, the passband is decreased, as indicated by an arrow A. That is, when N3/N1 is changed so that N3/N1 increases, a spurious component does not appear until N3/N1 reaches about 2.58. Accordingly, it is desirable that N3/N1 is less than or equal to about 2.58.

Subsequently, N1, N2, N4, and N5 were determined so that N2=N4=27 (fixed number) and N1=N5. Then, in contrast to the above-described example, N1, N3, and N5 were changed so that N3/N1 was sequentially decreased. In this manner, a plurality of surface acoustic wave filters were produced. The frequency characteristics of these surface acoustic wave filters on the lower side of the passband are illustrated in FIG. 4.

Figure 4:
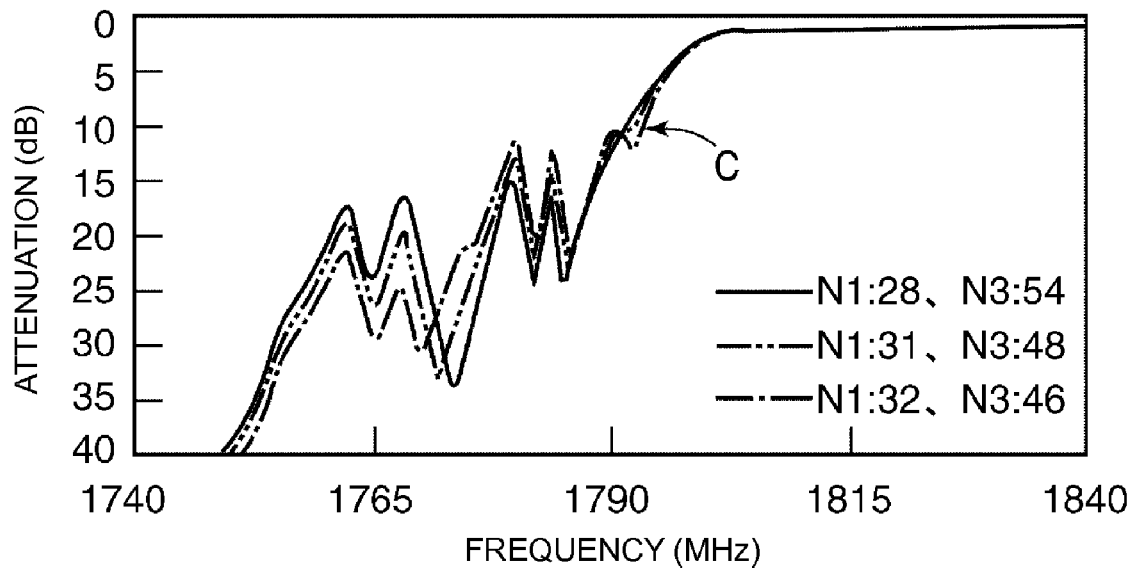
FIG. 4 illustrates a change in the frequency characteristic on the low frequency side of the passband when the numbers of electrode fingers N1 and N3 that respectively determine the center frequencies of first and third IDTs are changed.

As shown in FIG. 4, when N1=32 and N3=46, that is, when N3/N1=1.44, a large spurious component appears on the lower side of the passband, as indicated by an arrow C. However, when N1=31 and N3=48, that is, when N3/N1 is greater than or equal to about 1.55, few spurious components appear. That is, when N3/N1 is changed so as to be decreased, few spurious components appear until N3/N1 reaches about 1.55.

Similarly, N2 and N4 were changed to 23 and 31, respectively. In the same manner as described above, N1, N3, and N5 were changed so that a ratio of N3/N1 that does not generate a spurious component was determined. The result is shown in Table 1.

TABLE 1

| Values of N2 and N4 | Range of N3/N1 that does not generate spurious component |
|---|---|
| 23 | 1.50 ≦ N3/N1 ≦ 2.85 |
| 27 | 1.55 ≦ N3/N1 ≦ 2.58 |
| 31 | 1.48 ≦ N3/N1 ≦ 2.70 |

As shown in Table 1, even when the values of N2 and N4 are significantly changed, the range of N3/N1 that does not generate a spurious component on the lower side of the passband is not substantially changed. That is, even when the values of N2 and N4 changed, the appearance of a spurious component is prevent if N3/N1 is set to be 1.55≦N3/N1≦2.58.

As shown from the results of the experiment, to reduce the appearance of a spurious component on the side lower than the passband and very close to the passband, it is important that the numbers of electrode fingers N1, N3, and N5 that determine the center frequencies of the first, third, and fifth IDTs 11, 13, and 15 are adjusted so that the numbers of pairs of electrode fingers of the IDTs 11, 13, and 15 satisfy 1.55≦N3/N1≦2.58 and N1=N5. The present inventor discovered that the condition 1.55≦N3/N1≦2.58 and N1=N5 prevented the appearance of a spurious component on the lower side of the passband through the experiment. Prior to the present invention being applied, it was not know that only appropriately setting the values of N1, N3, and N5 could prevent the appearance of a spurious component on the passband.

Second Preferred Embodiment

Figure 5:
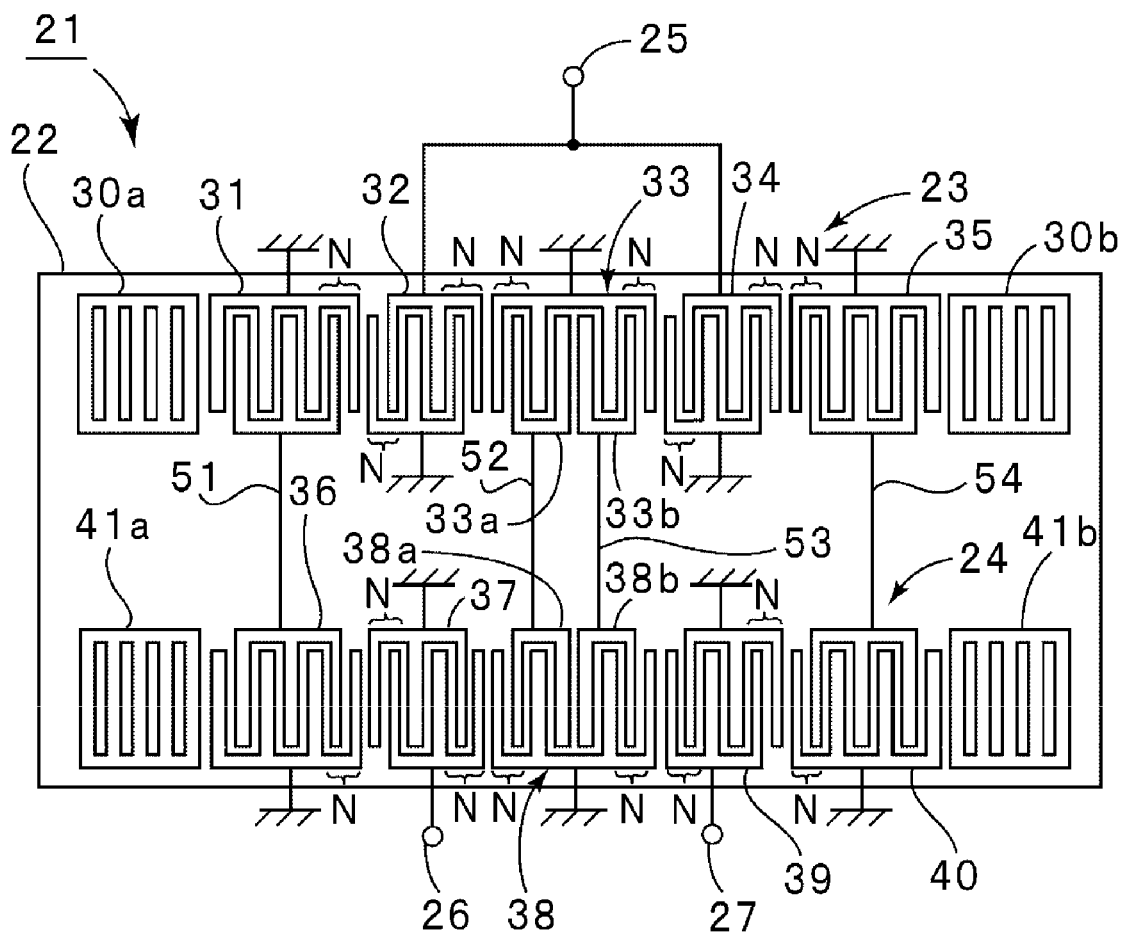
FIG. 5 is a plan view schematically illustrating a surface acoustic wave filter according to a second preferred embodiment of the present invention.

FIG. 5 is a plan view schematically illustrating the electrode structure of a surface acoustic wave filter according to a second preferred embodiment of the present invention.

According to the second preferred embodiment, a surface acoustic wave filter 21 includes first and second surface acoustic wave filter units 23 and 24 provided on a piezoelectric substrate 22. Each of the first and second surface acoustic wave filter units 23 and 24 is a 5-IDT longitudinally coupled resonator type balanced surface acoustic wave filter. The second surface acoustic wave filter unit 24 is connected in a cascade arrangement to the first surface acoustic wave filter unit 23. According to this preferred embodiment of the present invention, as described above, the two surface acoustic wave filter units 23 and 24 may be longitudinally connected in a two-stage arrangement.

The first surface acoustic wave filter unit 23 includes first to fifth IDTs 31 to 35 disposed along the surface acoustic wave propagation direction. In addition, reflectors 30a and 30b are disposed at either end of an area where the first to fifth IDTs 31 to 35 are disposed in the surface acoustic wave propagation direction. The IDTs 31 to 35 and the reflectors 30a and 30b have structures similar to those of the IDTs 11 to 15 and the reflectors 16 and 17 according to the first preferred embodiment, respectively.

Similarly, the second surface acoustic wave filter unit 24 includes five IDTs, a sixth IDT 36 to a tenth IDT 40. Reflectors 41a and 41b are provided at either end of an area where the IDTs 36 to 40 are disposed in the surface acoustic wave propagation direction. Here, the IDTs 36 to 40, except for the ninth IDT 39, have shapes that are symmetrical to those of the IDTs 31 to 35 with respect to a center line passing between the surface acoustic wave filter units 23 and 24 and extending in the surface acoustic wave propagation direction, respectively. The phase of the ninth IDT 39 is the same as the phase of the seventh IDT 37. In addition, like the third IDT 33, the eighth IDT 38 is divided into two portions in the surface acoustic wave propagation direction. That is, the eighth IDT 38 includes a first sub-IDT portion 38a and a second sub-IDT portion 38b.

Additionally, the sixth to tenth IDTs 36 to 40 have the narrow-pitch electrode finger portions N.

One end of the second IDT 32 and one end of the fourth IDT 34 of the first surface acoustic wave filter unit 23 are connected to an unbalanced terminal 25. In addition, the first IDT 31 is electrically connected to the sixth IDT 36 of the second surface acoustic wave filter unit 24 using a first signal line 51. Furthermore, first and second divided portions 33a and 33b of the third IDT 33 of the first surface acoustic wave filter unit 23 are electrically connected to the first and second sub-IDT portions 38a and 38b of the eighth IDT 38 of the second surface acoustic wave filter unit 24 using second and third signal lines 52 and 53, respectively. The fifth IDT 35 of the first surface acoustic wave filter unit 23 is electrically connected to the tenth IDT 40 of the second surface acoustic wave filter unit 24 using a fourth signal line 54.

The seventh IDT 37 and the ninth IDT 39 of the second surface acoustic wave filter unit 24 are electrically connected to a first balanced terminal 26 and a second balanced terminal 27, respectively.

Let N6 to N10 denote the numbers of electrode fingers that determine the center frequencies of the sixth IDT 36 to the tenth IDT 40, respectively. Then, even in the above-described structure in which the first and second surface acoustic wave filter units 23 and 24 are longitudinally connected in a two-stage arrangement, if the conditions of $1.55 \leq N3/N1 \leq 2.58$ and $N1=N5$ are satisfied in the first surface acoustic wave filter unit 23 and the conditions of $1.55 \leq N8/N6 \leq 2.58$ and $N6=N10$ are satisfied in the second surface acoustic wave filter unit 24, the appearance of a spurious component in the vicinity of the passband is efficiently prevented, as in the first preferred embodiment.

Furthermore, since the surface acoustic wave filter 21 has a two-stage longitudinal connection structure, the attenuation outside the passband is increased. Still furthermore, as in the second preferred embodiment, if the IDTs 31 to 35 and the IDTs 36 to 40 are configured such that signals propagating in the first signal line 51 and the third signal line 53 and signals propagating in the second signal line 52 and the fourth signal line 54 have a phase difference of 180° with respect to each other, the balance of the surface acoustic wave filter 21 is preferably improved.

Third Preferred Embodiment

Figure 6:
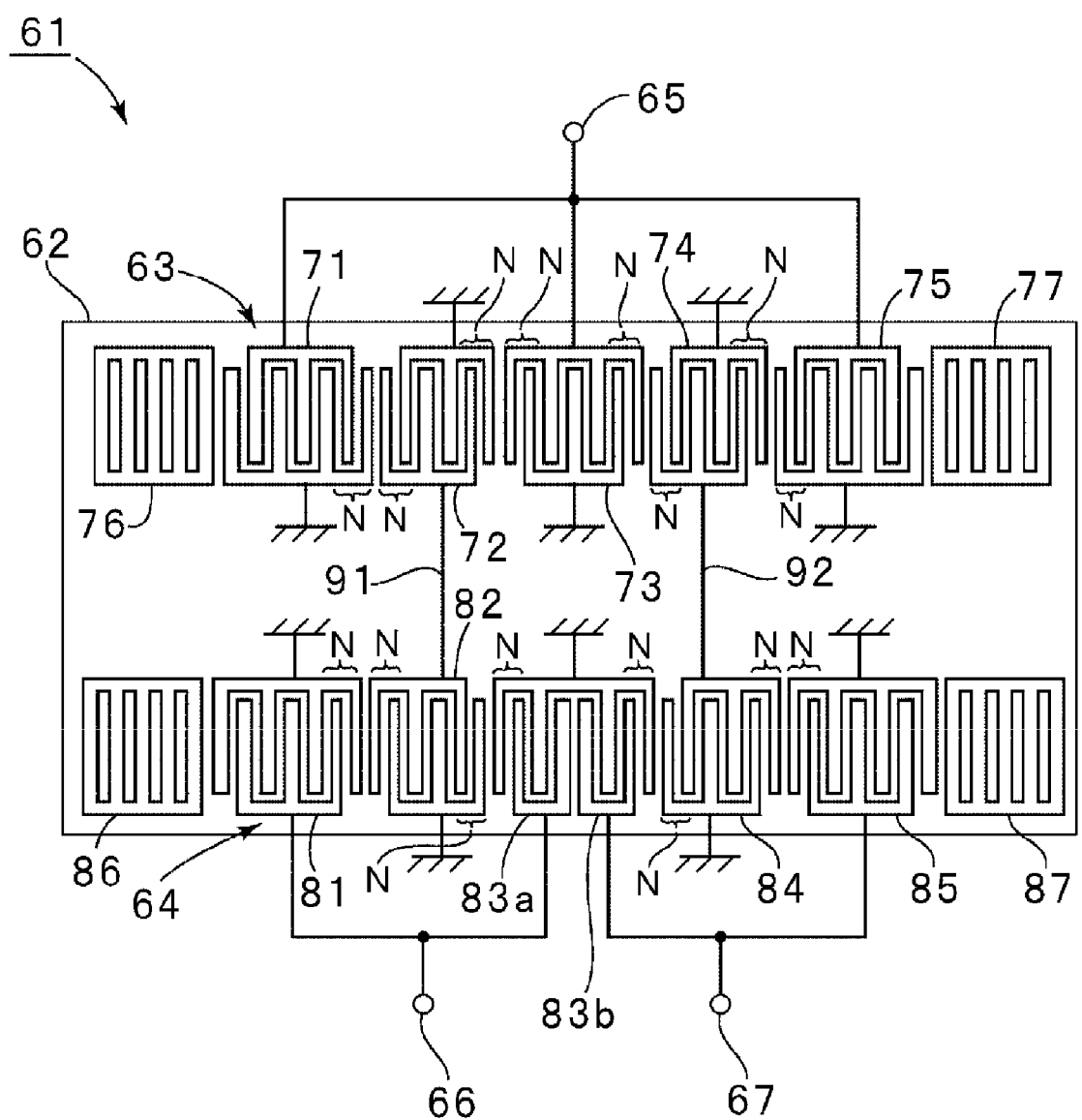
FIG. 6 is a plan view schematically illustrating a surface acoustic wave filter according to a third preferred embodiment of the present invention.
Figure 7:
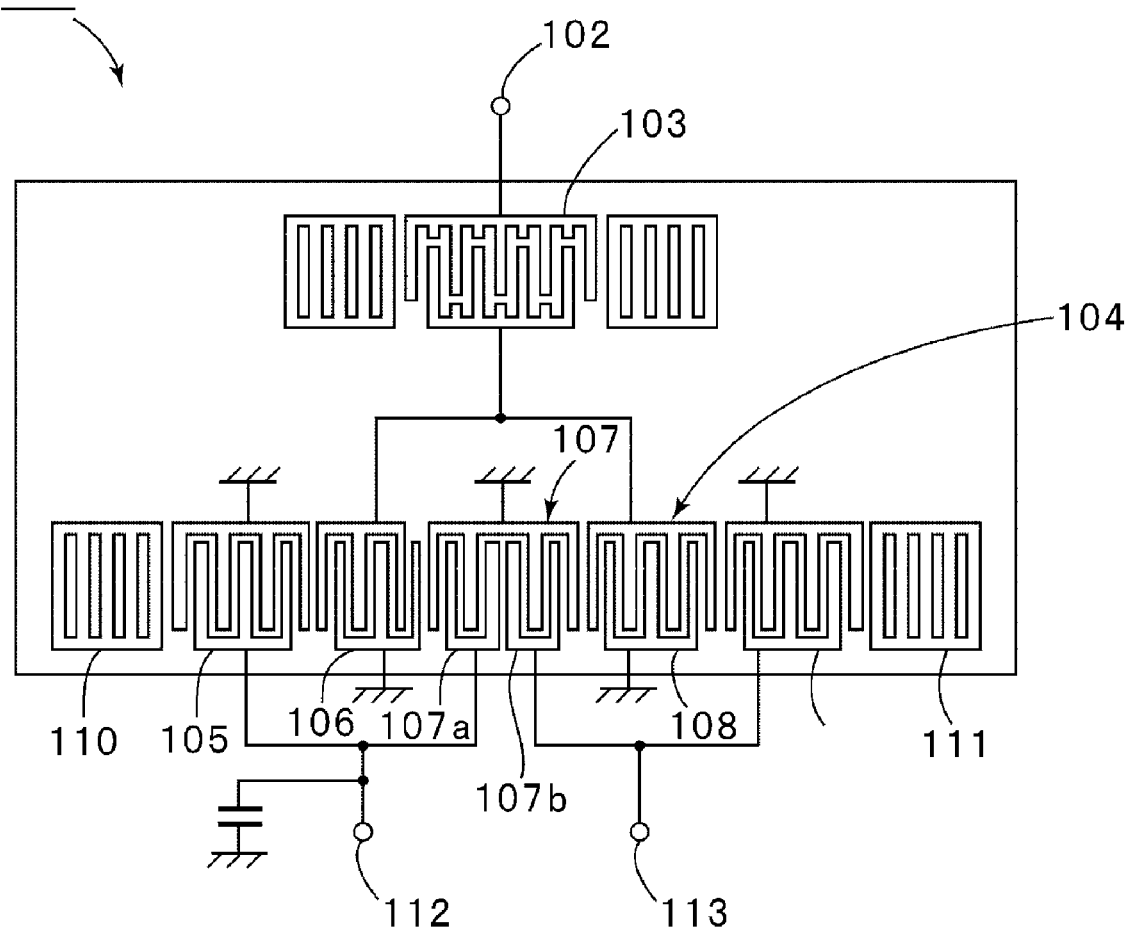
FIG. 7 is a plan view schematically illustrating an example of a known surface acoustic wave filter.

FIG. 6 is a plan view schematically illustrating the electrode structure of a surface acoustic wave filter according to a third preferred embodiment of the present invention. In a surface acoustic wave filter 61 according to the third preferred embodiment, a second surface acoustic wave filter unit 63 is provided on a piezoelectric substrate 62 in the previous stage of a first surface acoustic wave filter unit 64. The second surface acoustic wave filter unit 63 is connected in a cascade arrangement to the first surface acoustic wave filter unit 64 in a two-stage arrangement.

The second surface acoustic wave filter unit 63 includes sixth to tenth IDTs 71 to 75 disposed along the surface acoustic wave propagation direction. In addition, the second surface acoustic wave filter unit 63 includes reflectors 76 and 77 disposed at either end of an area at which the IDTs 71 to 75 are disposed in the surface acoustic wave propagation direction. The IDTs 71 to 75 include the narrow-pitch electrode finger portions N at positions at which two IDTs face each other.

However, unlike the acoustic wave filter 1 according to the first preferred embodiment, the eighth IDT 73 preferably includes no sub-IDT portions. One end of the sixth IDT 71, one end of the eighth IDT 73, and one end of the tenth IDT 75 of the second surface acoustic wave filter unit 63 are mutually connected and are electrically connected to an unbalanced terminal 65. In addition, the phase of the seventh IDT 72 is reversed to that of the ninth IDT 74.

In contrast, the first surface acoustic wave filter unit 64 includes first to fifth IDTs 81 to 85 and reflectors 86 and 87. The configurations of the first IDT 81 to the fifth IDT 85 and the reflectors 86 and 87 are similar to those of the first IDT 11 to the fifth IDT 15 and the reflectors 16 and 17 according to the first preferred embodiment, respectively. Accordingly, the first IDT 81 and a first sub-IDT portion 83a of the third IDT 83 are electrically connected to a first balanced terminal 66. A second sub-IDT portion 83b of the third IDT 83 and the fifth IDT 85 are electrically connected to a second balanced terminal 67. The phase of the second IDT 82 is the same as the phase of the fourth IDT 84. The second IDT 82 is electrically connected to the seventh IDT of the second surface acoustic wave filter unit 63 using a first signal line 91. The fourth IDT 84 is electrically connected to the ninth IDT 74 of the second surface acoustic wave filter unit 63 using a second signal line 92.

According to the present preferred embodiment, a signal propagating in the first signal line 91 and a signal propagating in the second signal line 92 have a phase difference of 180° with respect to each other.

Let N1 to N5 denote the numbers of electrode fingers that determine the center frequencies of the first IDT 81 to the fifth IDT 85, respectively. According to the present preferred embodiment, by satisfying the conditions of $1.55 \leq N3/N1 \leq 2.58$ and $N1=N5$, the occurrence of a spurious component in the vicinity of the passband is efficiently prevented, similar to the surface acoustic wave filter 1 according to the first preferred embodiment. In addition, since the second surface acoustic wave filter unit 63 is connected to the front end of the surface acoustic wave filter unit 64, the attenuation outside the passband can be increased.

Furthermore, since a signal propagating in the first signal line 91 and a signal propagating in the second signal line 92 have a phase difference of 180° with respect to each other, the balance of the surface acoustic wave filter 61 is efficiently improved.

As noted above, according to various preferred embodiments of the present invention, a 5-IDT longitudinally coupled resonator type balanced surface acoustic wave filter having a structure different from the above-described surface acoustic wave filter according to the first preferred embodiment may be connected in the previous stage of the surface acoustic wave filter according to the first preferred embodiment that satisfies the conditions of $1.55 \leq N3/N1 \leq 2.58$ and N1=N5.

While the above-described preferred embodiments have been described with reference to a 40±5° Y-cut X-propagation LiTaO$_3$ substrate as the piezoelectric substrate, another type of piezoelectric substrate may be used. For example, a variety of piezoelectric single-crystal substrates, such as a 64°-72° Y-cut X-propagation LiNbO$_3$ substrate or a 41° Y-cut X-propagation LiNbO$_3$ substrate, may be used. In addition, in place of the piezoelectric single crystal, the piezoelectric substrate may be made from a piezoelectric ceramic.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced surface acoustic wave filter having an unbalanced terminal and first and second balanced terminals and having a balanced-unbalanced conversion function, comprising:
   a piezoelectric substrate; and
   first to fifth IDTs arranged on the piezoelectric substrate along a surface acoustic wave propagation direction; wherein
   the second and fourth IDTs are connected to the unbalanced terminal, and the second IDT and the fourth IDT have a phase difference of 180° with respect to each other;
   the third IDT is divided into a first sub-IDT portion and a second sub-IDT portion along the surface acoustic wave propagation direction, the first sub-IDT portion and the first IDT are connected to the first balanced terminal, and the second sub-IDT portion and the fifth IDT are connected to the second balanced terminal; and
   conditions of $1.55 \leq N3/N1 \leq 2.58$ and N1=N5 are satisfied, where N1 denotes the number of electrode fingers that determines the center frequency of the first IDT, N3 denotes the number of electrode fingers that determines the center frequency of the third IDT, and N5 denotes the number of electrode fingers that determines the center frequency of the fifth IDT.

2. A balanced surface acoustic wave filter having an unbalanced terminal and first and second balanced terminals and having a balanced-unbalanced conversion function, comprising:
   a piezoelectric substrate; and
   first to fifth IDTs arranged on the piezoelectric substrate along a surface acoustic wave propagation direction; wherein
   the second and fourth IDTs are connected to the unbalanced terminal, and the second IDT and the fourth IDT have a phase difference of 180° with respect to each other;
   the third IDT is divided into a first sub-IDT portion and a second sub-IDT portion along the surface acoustic wave propagation direction; and
   conditions of $1.55 \leq N3/N1 \leq 2.58$ and N1=N5 are satisfied, where N1 denotes the number of electrode fingers that determine the center frequency of the first IDT, N3 denotes the number of electrode fingers that determines the center frequency of the third IDT, and N5 denotes the number of electrode fingers that determines the center frequency of the fifth IDT;
   the balanced surface acoustic wave filter further comprising:
   a second surface acoustic wave filter unit connected in a cascade arrangement to a first surface acoustic wave filter unit including the first to fifth IDTs; wherein
   the second surface acoustic wave filter unit includes a piezoelectric substrate and sixth to tenth IDTs disposed on the piezoelectric substrate along a surface acoustic wave propagation direction;
   the eighth IDT is divided into a first sub-IDT portion and a second sub-IDT portion along the surface acoustic wave propagation direction;
   conditions of $1.55 \leq N8/N6 \leq 2.58$ and N6=N10 are satisfied, where N6 denotes the number of electrode fingers that determines the center frequency of the first IDT, N8 denotes the number of electrode fingers that determines the center frequency of the eigth IDT, and N10 denotes the number of electrode fingers that determines the center frequency of the tenth IDT; and
   the first IDT, the first sub-IDT portion, the second sub-IDT portion, and the fifth IDT of the first surface acoustic wave filter unit are connected to the sixth IDT, the first sub-IDT portion of the eighth IDT, the second sub-IDT portion of the eighth IDT, and the ninth IDT of the second surface acoustic wave filter unit via first to fourth signal lines, respectively.

3. The balanced surface acoustic wave filter according to claim 2, wherein signals propagating in the first and third signal lines and signals propagating in the second and fourth signal lines have a phase difference of 180° with respect to each other.

4. A balanced surface acoustic wave filter having an unbalanced terminal and first and second balanced terminals and having a balanced-unbalanced conversion function, comprising:
   a piezoelectric substrate; and
   first to fifth IDTs arranged on the piezoelectric substrate along a surface acoustic wave propagation direction; wherein
   the second and fourth IDTs are connected to the balanced signal lines;
   the third IDT is divided into a first sub-IDT portion and a second sub-IDT portion along the surface acoustic wave propagation direction, the first sub-IDT portion and the first IDT are connected to the first balanced terminal, and the second sub-IDT portion and the fifth IDT are connected to the second balanced terminal; and
   conditions of $1.55 \leq N3/N1 \leq 2.58$ and N1=N5 are satisfied, where N1 denotes the number of electrode fingers that determines the center frequency of the first IDT, N3 denotes the number of electrode fingers that determines the center frequency of the third IDT, and N5 denotes the number of electrode fingers that determines the center frequency of the fifth IDT;

the balanced surface acoustic wave filter further comprising:

a second surface acoustic wave filter unit longitudinally connected between the unbalanced terminal and a first surface acoustic wave filter unit including the first to fifth IDTs; wherein the second IDT and the fourth IDT have the same phase;

the second surface acoustic wave filter unit includes a piezoelectric substrate and sixth to tenth IDTs disposed on the piezoelectric substrate along a surface acoustic wave propagation direction;

the seventh IDT and the ninth IDT have a phase difference of 180° with respect to each other;

the sixth IDT, the eighth IDT, and the tenth IDT are connected to the unbalanced terminal; and the seventh IDT and the ninth IDT are electrically connected to the second IDT and the fourth IDT using a first signal line and a second signal line, respectively.

5. The balanced surface acoustic wave filter according to claim 4, wherein a signal propagating in the first signal line and a signal propagating in the second signal line have a phase difference of 180° with respect to each other.

* * * * *